US012237445B2

(12) United States Patent
Ng et al.

(10) Patent No.: US 12,237,445 B2
(45) Date of Patent: Feb. 25, 2025

(54) PRINT PROCESS FOR COLOR CONVERSION LAYER USING POROUS HOST OR POSITIVE PHOTORESIST

(71) Applicant: Applied Materials, Inc., Santa Clara, CA (US)

(72) Inventors: Hou T. Ng, Campbell, CA (US); Nag B. Patibandla, Pleasanton, CA (US); Giorgio Cellere, Torri di Quartesolo (IT); Daihua Zhang, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 282 days.

(21) Appl. No.: 17/692,012

(22) Filed: Mar. 10, 2022

(65) Prior Publication Data

US 2022/0293826 A1 Sep. 15, 2022

Related U.S. Application Data

(60) Provisional application No. 63/160,696, filed on Mar. 12, 2021.

(51) Int. Cl.
*H01L 21/00* (2006.01)
*B29D 11/00* (2006.01)
(Continued)

(52) U.S. Cl.
CPC ........ *H01L 33/50* (2013.01); *B29D 11/00634* (2013.01); *G02B 5/286* (2013.01);
(Continued)

(58) Field of Classification Search
CPC ............... H01L 33/50; H01L 25/0753; B29D 11/00634; G02B 5/286; G03F 7/0005; G03F 7/039
See application file for complete search history.

(56) References Cited

U.S. PATENT DOCUMENTS 6,635,363 B1  10/2003  Duclos et al.
8,227,269 B2  7/2012  Chen et al.
(Continued)

FOREIGN PATENT DOCUMENTS

CN  109638138  4/2019
CN  108257949  2/2020
(Continued)

OTHER PUBLICATIONS

International Search Report and Written Opinion in International Appln. No. PCT/US2022/019828, dated Jun. 24, 2022, 10 pages.

*Primary Examiner* — Richard A Booth
(74) *Attorney, Agent, or Firm* — Fish & Richardson P.C.

(57) ABSTRACT

A method of fabricating a multi-color display includes forming a host matrix over a display having an array of light emitting diodes. The host matrix is sensitive to ultraviolet light. A first plurality of light emitting diodes in a first plurality of wells are activated to illuminate a portion of the host matrix to cause the portion of the host matrix to develop internal porous structures. A first photo-curable fluid including a first color conversion agent is dispensed. The first plurality of light emitting diodes in the first plurality of wells are activated to illuminate and cure the first photo-curable fluid to form a first color conversion layer over each of the first plurality of light emitting diodes, and an uncured remainder of the first photo-curable fluid is removed.

13 Claims, 11 Drawing Sheets

(51) Int. Cl.
  *G02B 5/28* (2006.01)
  *H01L 25/075* (2006.01)
  *H01L 33/50* (2010.01)
  G03F 7/00 (2006.01)
  G03F 7/039 (2006.01)

(52) U.S. Cl.
  CPC ........ *H01L 25/0753* (2013.01); *G03F 7/0005* (2013.01); *G03F 7/039* (2013.01); *H01L 2933/0041* (2013.01)

(56) References Cited

U.S. PATENT DOCUMENTS

| | | | |
|---|---|---|---|
| 8,323,748 | B2 | 12/2012 | Ling |
| 8,425,065 | B2 | 4/2013 | Ravillisetty et al. |
| 9,111,464 | B2 | 8/2015 | Bibl et al. |
| 10,048,530 | B1 | 8/2018 | Kim et al. |
| 11,094,530 | B2 | 8/2021 | Zhang |
| 11,239,213 | B2 | 2/2022 | Zhang et al. |
| 2006/0105483 | A1 | 5/2006 | Leatherdale et al. |
| 2008/0278068 | A1 | 11/2008 | Huang et al. |
| 2010/0117106 | A1 | 5/2010 | Trottier |
| 2010/0181582 | A1 | 7/2010 | Li et al. |
| 2010/0295077 | A1 | 12/2010 | Melman |
| 2012/0187423 | A1 | 7/2012 | Tsai et al. |
| 2012/0267997 | A1 | 10/2012 | Kijima et al. |
| 2012/0285379 | A1 | 11/2012 | Hirakata et al. |
| 2015/0255505 | A1 | 9/2015 | Jeoung et al. |
| 2017/0244010 | A1 | 8/2017 | Kim et al. |
| 2018/0074240 | A1 | 3/2018 | Bonar et al. |
| 2018/0156951 | A1 | 6/2018 | Baek et al. |
| 2018/0277525 | A1 | 9/2018 | Cok et al. |
| 2018/0308420 | A1 | 10/2018 | Shin et al. |
| 2018/0366622 | A1 | 12/2018 | Ulmer |
| 2019/0107755 | A1 | 4/2019 | Chen |
| 2020/0088920 | A1 | 3/2020 | Sakaino et al. |
| 2020/0152841 | A1 | 5/2020 | Han et al. |
| 2020/0365566 | A1 | 11/2020 | Zhang et al. |
| 2020/0365774 | A1 | 11/2020 | Zhang et al. |
| 2021/0151626 | A1* | 5/2021 | Dohner ................. H01L 33/502 |
| 2021/0358742 | A1 | 11/2021 | Zhang et al. |
| 2022/0069173 | A1* | 3/2022 | Luo ......... H01L 33/30 |
| 2022/0069174 | A1* | 3/2022 | Luo ......... C08F 2/44 |
| 2022/0189933 | A1 | 6/2022 | Zhang et al. |
| 2022/0288878 | A1* | 9/2022 | Ng ................. B29D 11/00634 |
| 2023/0155075 | A1* | 5/2023 | Hartlove ................ H01L 33/46 257/76 |

FOREIGN PATENT DOCUMENTS

| | | |
|---|---|---|
| JP | 2006-071645 | 3/2006 |
| JP | 2008-159756 | 7/2008 |
| JP | 2010-267900 | 11/2010 |
| TW | 201643532 | 12/2016 |
| TW | 201904105 | 1/2019 |
| TW | 201911565 | 3/2019 |

* cited by examiner

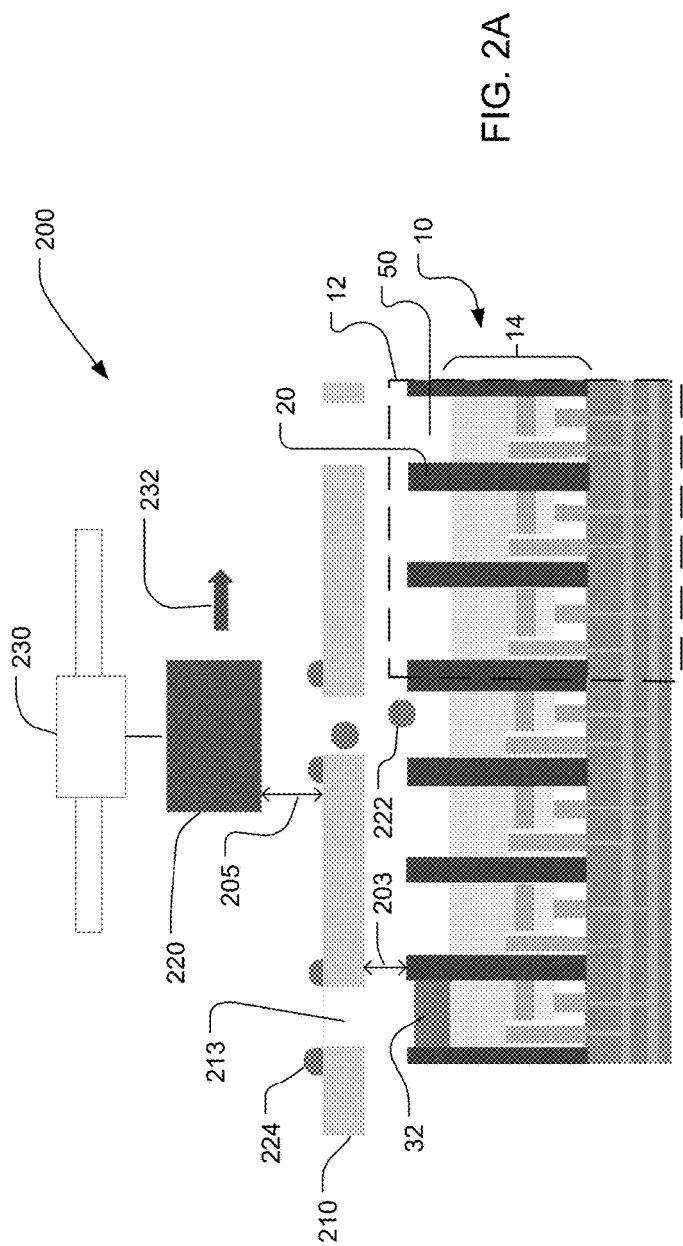
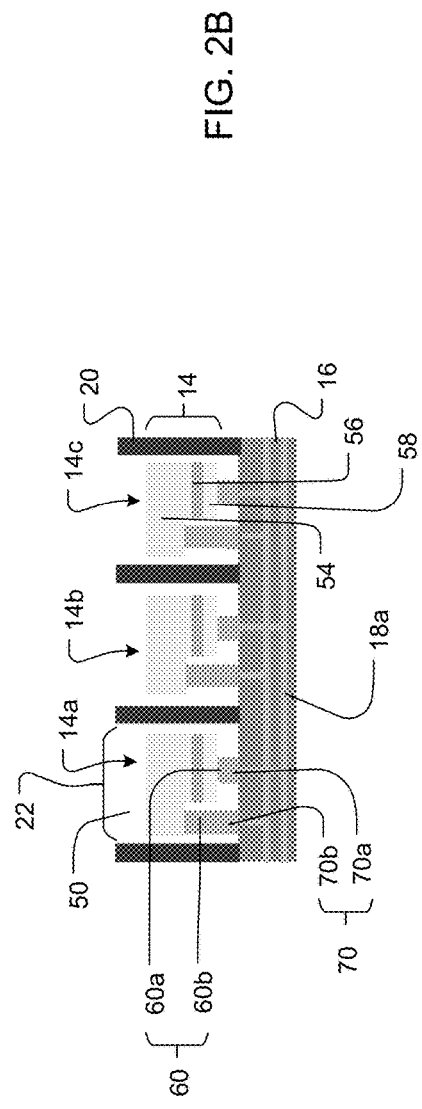
FIG. 2A
FIG. 2B

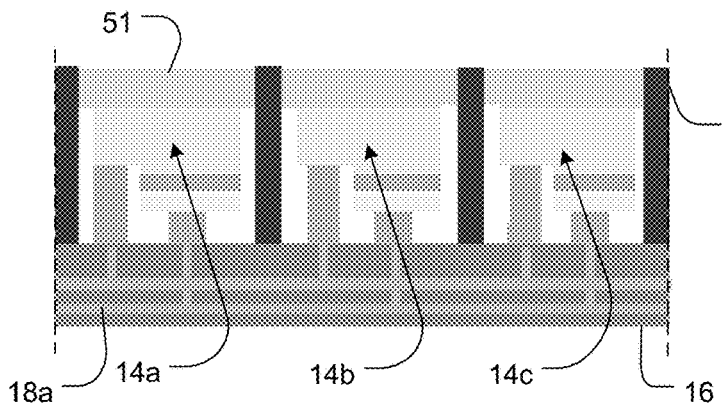
FIG. 5A
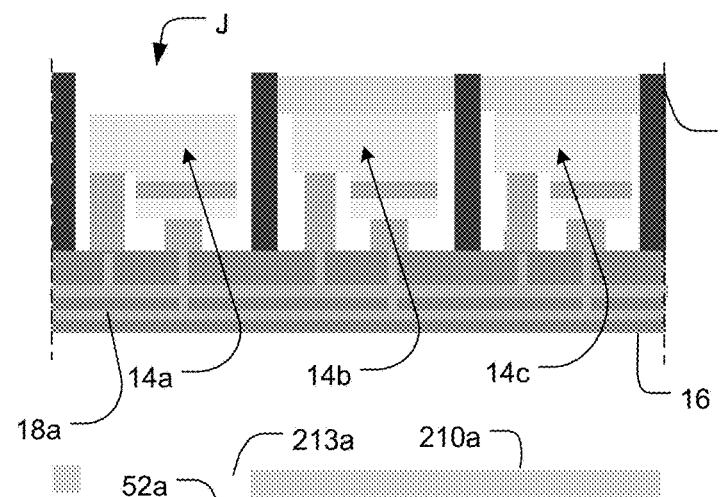
FIG. 5B
FIG. 5C
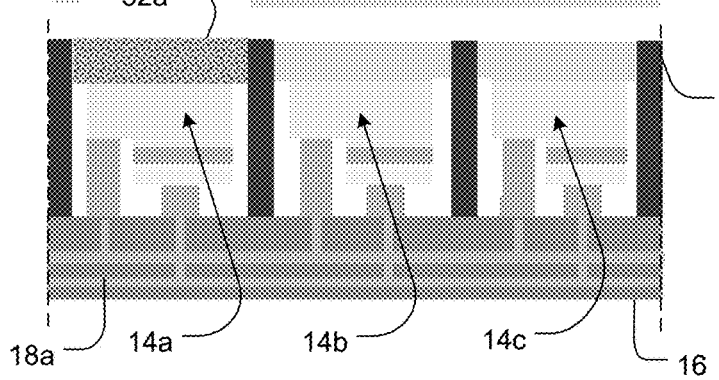
FIG. 5D
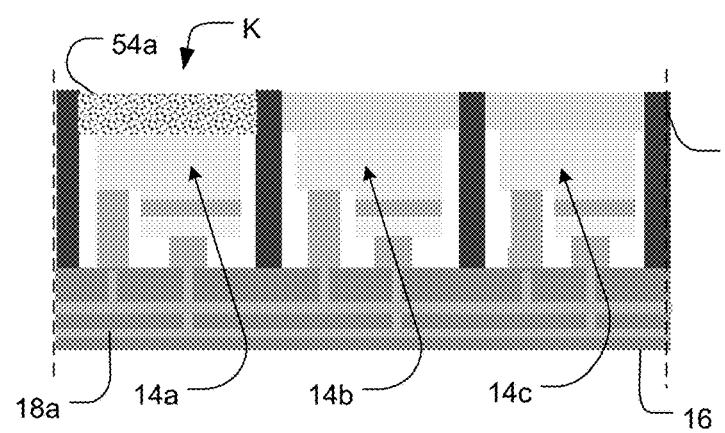

PRINT PROCESS FOR COLOR CONVERSION LAYER USING POROUS HOST OR POSITIVE PHOTORESIST

CROSS-REFERENCE TO RELATED APPLICATIONS

This application claims the benefit of priority to U.S. Application No. 63/160,696, filed on Mar. 12, 2021, the contents of which are hereby incorporated by reference.

TECHNICAL FIELD

This disclosure generally relates to fabrication of micro-LED displays, and in particular to techniques for printing a color conversion layer using a mask.

BACKGROUND

A light emitting diode (LED) panel uses an array of LEDs, with individual LEDs providing individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to organic light emitting diodes (OLEDs), e.g., higher energy efficiency, brightness, and lifetime. Micro-LEDs can have fewer material layers in the display stack, which can simplify manufacturing. However, there are challenges to fabrication of micro-LED panels. Micro-LEDs having different color emission (e.g., red, green, and blue pixels) need to be fabricated on different substrates through separate processes. Integration of the multiple colors of micro-LED devices onto a single panel requires a pick-and-place step to transfer the micro-LED devices from their original donor substrates to a destination substrate. This often involves modification of the LED structure or fabrication process, such as introducing sacrificial layers to ease the release. In addition, stringent requirements on placement accuracy (e.g., less than 1 μm) limit either the throughput, the final yield, or both.

An alternative approach to bypass the pick-and-place step is to selectively deposit color conversion agents (e.g., quantum dots, nanostructures, florescent materials, or organic substances) at specific pixel locations on a substrate fabricated with monochrome LEDs. The monochrome LEDs can generate relatively short wavelength light, e.g., violet or blue light, and the color conversion agents can convert this short wavelength light into longer wavelength light, e.g., red or green light for red or green pixels.

SUMMARY

In one aspect, a method of fabricating a multi-color display includes dispensing a first photo-curable fluid through a first plurality of apertures in a first mask into a first plurality of wells in a display. The display has a backplane and an array of light emitting diodes in respective wells electrically integrated with a backplane circuitry of the backplane. The first photo-curable fluid includes a first color conversion agent. A first plurality of light emitting diodes in the first plurality of wells in the array of light emitting diodes are activated to illuminate and cure the first photo-curable fluid to form a first color conversion layer over each of the first plurality of light emitting diodes to convert light from the first plurality of light emitting diodes to light of a first color. An uncured remainder of the first photo-curable fluid is removed. A second photo-curable fluid is dispensed through a second plurality of apertures in a second mask into a second plurality of wells in the display. The second photo-curable fluid includes a second color conversion agent, and the second mask includes a second plurality of feature holes arranged on the second mask. A second plurality of light emitting diodes in the second plurality of wells in the array of light emitting diodes are activated to illuminate and cure the second photo-curable fluid to form a second color conversion layer over each of the second plurality of light emitting diodes to convert light from the second plurality of light emitting diodes to light of a different second color. An uncured remainder of the second photo-curable fluid is removed.

In another aspect, a micro-LED display includes a backplane, a plurality of light-blocking walls disposed on the backplane forming a plurality of walls, an array of light emitting diodes in respective wells electrically integrated with backplane circuitry of the backplane, and a first color converting structure disposed over each of a first plurality of light emitting diodes from the array of light emitting diodes. The first color converting structure includes a porous first host layer with pores at least partially filled by a photo-cured first color conversion agent to convert light from the first plurality of light emitting diodes to light of a first color.

In another aspect, a method of fabricating a multi-color display includes forming a host matrix over a display having a backplane and an array of light emitting diodes electrically integrated with backplane circuitry of the backplane. The host matrix is sensitive to ultraviolet light and to develop internal porous structures when exposed to light of the light emitting diodes. A first plurality of light emitting diodes in a first plurality of wells are activated to illuminate a portion of the host matrix that is over the first plurality of light emitting diodes to cause the portion of the host matrix to develop internal porous structures. A first photo-curable fluid including a first color conversion agent is dispensed. The first plurality of light emitting diodes in the first plurality of wells is activated to illuminate and cure the first photo-curable fluid to form a first color conversion layer over each of the first plurality of light emitting diodes to convert light from the first plurality of light emitting diodes to light of a first color. An uncured remainder of the first photo-curable fluid is removed.

In another aspect, a method of fabricating a multi-color display includes forming a positive photoresist layer over a display having a backplane and an array of light emitting diodes electrically integrated with backplane circuitry of the backplane, activating a first plurality of light emitting diodes in a first plurality of wells to expose a first portion of the positive photoresist layer that is over the first plurality of light emitting diodes, treating the positive photoresist layer with a developer to remove the exposed first portion of the positive photoresist layer, dispensing a first photo-curable fluid including a first color conversion agent into the first plurality of wells, the first photo-curable fluid, activating the first plurality of light emitting diodes in the first plurality of wells to illuminate and cure the first photo-curable fluid to form a first color conversion layer over each of the first plurality of light emitting diodes to convert light from the first plurality of light emitting diodes to light of a first color, and removing an uncured remainder of the first photo-curable fluid.

Implementations can optionally provide (and are not limited to) one or more of the following advantages.

Color conversion layers can be deposited in large format displays with high accuracy. For example, the described techniques can avoid depositing ink into unexpected subpixel wells because droplets of misaligned ink can be blocked from being deposited on the display by the masks (e.g., screening masks, or shadow masks). Defects due to inconsistent jetting directionality can be reduced, permitting finer k droplets used in color conversion layers with finer subpixel wells.

The techniques can provide higher throughput, as the screen print process or inkjetting process can be performed with relatively high speed scanning across a screen mask or a shadow mask. The screening mask or the shadow mask can be adapted to displays with varying screen resolutions. In-situ metrology feedback can be utilized to conduct corrective ink-jetting into desired subpixel wells.

A system described below can use a host matrix top layer. After treatment, the host matrix top layer can have an internal pore structure to evenly distribute ink, which can reduce unwanted thermal expansion during curing process and non-homogenous deposit distribution of ink within each subpixel well. Systems with a host matrix top layer enable production at reduced cost because a respective mask on the top layer (e.g., either a screen mask or a shadow mask) may not be required. Therefore the cost for aligning, cleaning, and maintaining masks can be reduced.

Moreover, the system can reduce waste of ink by selective deposition and efficient recycling of non-cured ink formulations. For example, ink need only be deposited to each subpixel well selectively, and the misaligned ink can be blocked by the screen mask. Uncured ink can be removed and recycled.

Other aspects, features, and advantages will be apparent from the description and drawings, and from the claims.

A variety of implementations are described below. It is contemplated that elements and features of one implementation may be beneficially incorporated in other implementations without further recitation.

BRIEF DESCRIPTION OF THE DRAWINGS

FIG. 2A is a schematic cross-sectional view of an example inkjet print system.

FIG. 2B is a schematic cross-sectional view of a portion of a micro-LED array from FIG. 2A.

FIGS. 5A-5K illustrate another example method of selectively forming color conversion agent (CCA) layers over a micro-LED array.

Like reference symbols in the various drawings indicate like elements.

DETAILED DESCRIPTION

Selective deposition of color conversion agents on a substrate can be performed using high-resolution masks, or controllable inkjet or aerosol jet printing. However, fabrication using these techniques becomes challenging when the subpixels are smaller than five microns across, and even more so when the deposition process is to be scaled up to a large substrate or an array of substrates. First, the masks can suffer from problems of misalignment with subpixel wells, or resolution mismatches against subpixel well sizes. This can result in ink formulation droplets being deposited in unwanted subpixel wells, and can eventually affect overall throughput, yield rate and tool uptime. Second, finer subpixel wells require finer ink formulation droplets to be deposited in each subpixel well. The finer ink formulation droplets have lower weight, and thus suffer from higher air resistance, which can increase inconsistency in inkjetting directionality, e.g., the orientation and location of each droplet landing in each pixel is different.

A technique that may address these problems employs one or more high resolution masks, e.g., electroformed metal masks. For example, a photo-curable fluid containing a color conversion agent (CCA) is selectively deposited into one or more subpixel wells on a substrate that corresponds to a given color, and the masks can be shadow masks that are aligned with subpixel wells to block misaligned ink formulation droplets. Alternatively, rather than being shadow masks used in inkjet printing, the masks can be used as screening masks in a screen printing process to print the color conversion agent (CCA) into the subpixel wells that correspond to a given color, in either case, the CCA is then cured in a self-aligned manner by light from the micro-LED, and the uncured fluid is removed or washed away. The same process can be repeated for the subpixel wells on the substrate corresponding to other colors. For simplicity and as described below, we refer to a printing system configured either for a screen print process or inkjetting process as the system, and corresponding masks, including various types of masks such as screening masks or shadow masks, as the masks.

Figure 1A:
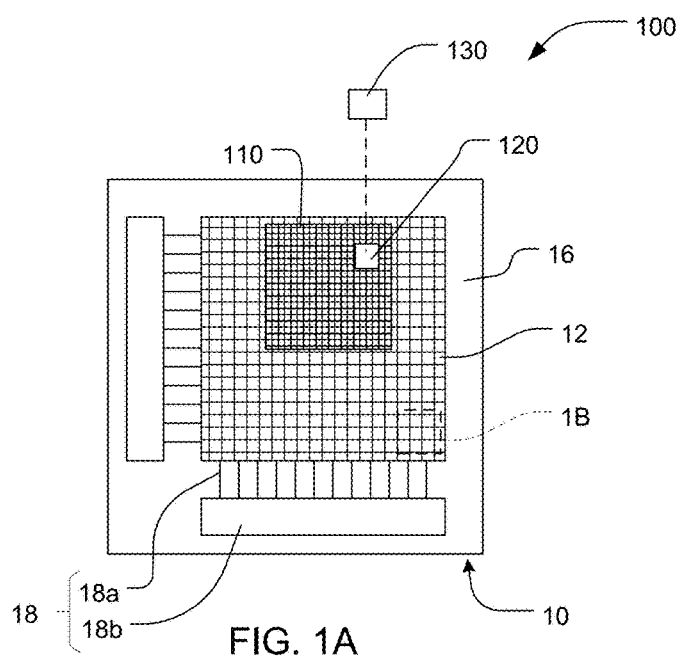
FIG. 1A is a schematic top view of an example system for printing a color conversion layer onto a micro-LED display.

FIG. 1A illustrates a schematic top view of an example system 100 for printing a color conversion layer onto a micro-LED display 10. The micro-LED display 10 includes an array 12 of individual micro-LEDs 14 (see FIG. 1B) disposed on a backplane 16. Each individual micro-LED 14 can be controlled, e.g., activated or deactivated, independently as being integrated with backplane circuitry 18. For example, the backplane circuitry 18 can include a TFT active matrix array with a thin-film transistor and a storage capacitor (not illustrated) for each micro-LED, column address and row address lines 18a, column and row controllers 18b, etc., to control each micro-LED 14. Alternatively, each micro-LED 14 can be controlled by a passive matrix in the backplane circuitry 18. The backplane 16 can be fabricated using conventional CMOS processes.

The system 100 also includes a mask 110 located above the micro-LED display 10 and having apertures (113a, 113b, 113c, or 113d, see FIGS. 1C-1F) aligned with subpixels wells of the array 12. The mask 110 can be supported on a support (not depicted) of the system and stay fixed or be movable relative to the backplane 16 of the micro-LED display 10. Although the mask 110 is depicted in FIG. 1A as smaller than the micro-LED display 10 (so that the mask would need to be moved relative to the array to complete the printing process), the mask can be the same size or larger than the array 12, In addition, the mask can be smaller than depicted, although the mask spans multiple subpixel wells. More than one mask 110 can be positioned over the micro-LED display 10, depending on the printing requirements.

For an inkjet printing system, the system 100 also includes a print head 120 located above the screen mask 110. The print head 120 is connected to photo-curable fluid supplies through supply lines (not depicted) and a first controller through control lines (not depicted). The print head 120 is configured to deposit photo-curable fluid droplets into subpixel wells of the array 12 through the apertures in the mask 110. Although only one print head 120 is depicted in FIG. 1A, there can be more print heads, depending on printing requirements. Operation of the printhead 120 is controlled by a system controller, e.g., a microcontroller or programmed general purpose computer.

The system 100 further includes one or more actuators 130 to control the relative movement between the backplane 16, the mask 110 and the print head 120. The actuators 130 can be controlled by the system controller to move the mask HO and printhead 120 along perpendicular horizontal axes. Even though there is only one actuator showing in FIG. 1A for the ease of illustration, there can be more actuators according to the number of print heads 120 and masks 110.

Figure 3A:
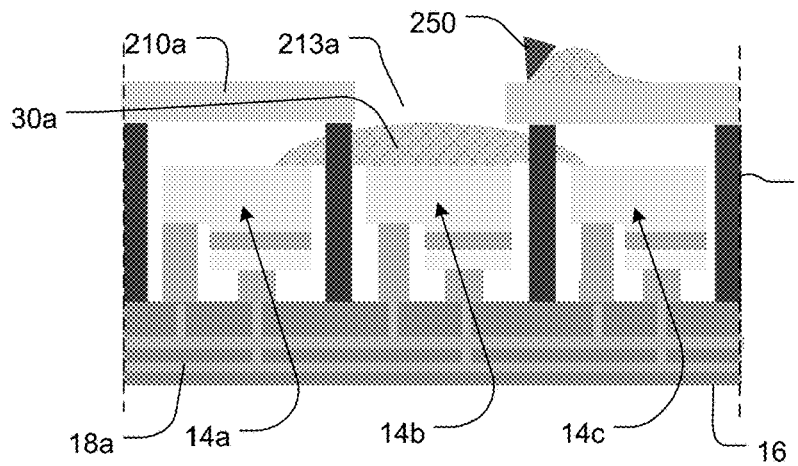
FIGS. 3A-3J illustrate an example method of selectively forming color conversion agent (CCA) layers over a micro-LED array.

For a screen printing system, the mask 110 provides a print screen mask, and the system 100 includes an ink spreader 250 (see FIG. 3A), such as a wiper blade or roller, to push ink across the backside of the mask 110 and through the apertures in the print screen mask into subpixel wells of the array 12. In some implementations, the screen print mask is at least locally pushed into contact with the substrate by the system.

Figure 1B:
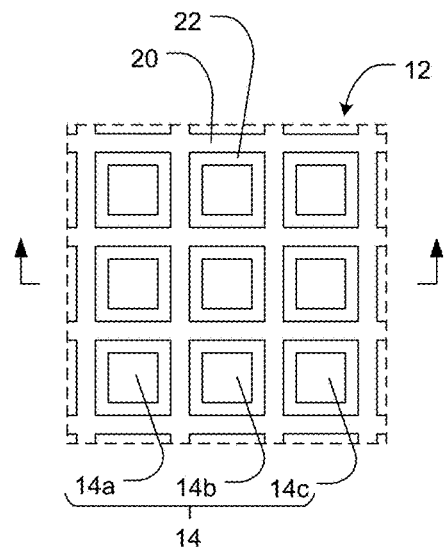
FIG. 1B is a schematic top view of a portion of a micro-LED array.

FIG. 1B illustrates a portion of the micro-LED array 12 with the individual micro-LEDs 14. All of the micro-LEDs 14 are fabricated with the same structure so as to generate the same wavelength range (his can be termed as "monochrome" micro-LEDs). For example, the micro-LEDs 14 can generate light in the ultraviolet (UV), the near ultraviolet, range. For example, the micro-LEDs 14 can generate light in a range of 365 to 405 nm. As another example, the micro-LEDs 14 can generate light in the violet or blue range. The micro-LEDs can generate light having a spectral bandwidth of 20 to 60 nm.

Further, assuming the micro-LED display is a three-color display, each pixel includes three sub-pixels, one for each color, e.g., one each for the blue, green and red color channels. As shown in FIG. 1B, the pixel 14 can include three micro-LEDs 14a, 14b, 14c. For example, the first micro-LED 14a can correspond to a blue subpixel, the second micro-LED 14b can correspond to a green subpixel, and the third micro-LED 14c can correspond to a red subpixel. The techniques discussed below are applicable to micro-LED displays that use a larger number of colors, e.g., four or more colors. In this case, each pixel can include four or more micro-LEDs, with each micro-LED corresponding to a respective color. In addition, the techniques discussed below are also applicable to micro-LED displays that use just two colors.

In general, the monochrome micro-LEDs 14 can generate light in a wavelength range having a peak with a wavelength no greater than the wavelength of the highest-frequency color intended for the display, e.g., violet or blue light. The color conversion agents can convert this short wavelength light into longer wavelength light, e.g., red or green light for red or green subpixels. If the micro-LEDs generate UV light, then color conversion agents can be used to convert the UV light into blue light for the blue subpixels.

Vertical isolation walls 20 (see also FIG. 2A) are formed between neighboring micro-LEDs to provide a plurality of subpixel wells. The isolation walls provide for optical isolation to help localize polymerization and reduce optical crosstalk during the in-situ polymerization discussed below. The isolation walls 20 can be a photoresist or metal, or combination thereof, and can be deposited by conventional lithography processes. As shown in FIG. 1B, the walls 20 can form a rectangular array, with each micro-LED 14 in an individual recess 22. i.e., a subpixel well, defined by the walls 20. Other array geometries, e.g., hexagonal or offset rectangular arrays, are also possible. The walls can have a height of about 3 to 20 μm. The walls can have a width of about 2 to 10 μm. The height can be greater than the width, e.g., the walls can have an aspect ratio of 1.5:1 to 5:1. The height of the wall is sufficient to block light from one micro-LED from reaching an adjacent micro-LED.

Figure 1C:
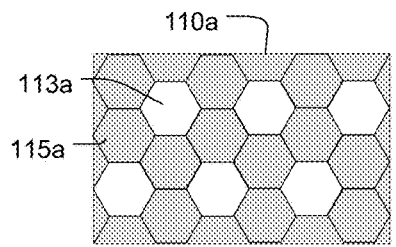
FIG. 1C-1F each illustrates an example design of mask in the system.
Figure 1D:
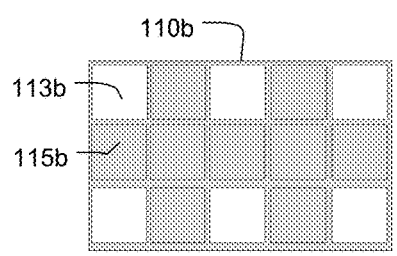
Figure 1E:
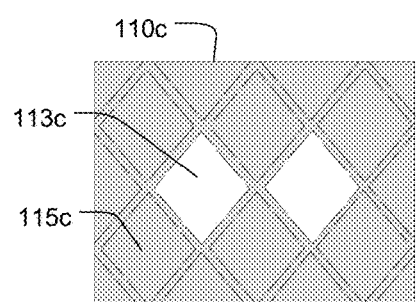
Figure 1F:
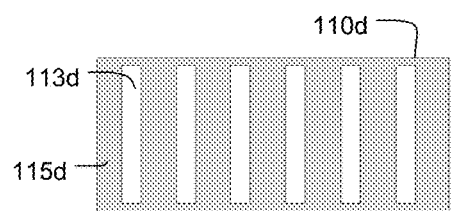

The high resolution mask 110 has apertures arranged in a pattern corresponding to the sub-pixel wells for a single color in the micro-LED display 10. For example, as shown in FIG. 1C, if the wells are arranged in a hexagonal pattern, then the mask 110a in the print system 100 can have hexagonal apertures 113a. Spots 115a in the mask 110a corresponding to wells for other colors in the micro-LED device do not have an aperture. As shown in FIG. 1D, if the wells are arranged in a rectangular pattern, then the mask 110b in the screen print system 100 can have rectangular/square apertures 113b. Again, spats 115b in the mask 110b corresponding to wells for other colors in the micro-LED device do not have an aperture. Alternatively, the wells and the apertures can have a shape of diamond or slender rectangle, as shown in FIG. 1E and FIG. 1F respectively.

FIG. 2A illustrates a schematic cross-sectional view of an example inkjet print system 200, which can provide the system 100 from FIG. 1A. The system 200 includes a mask 210 and a print head 220 attached to an actuator 230 such that the print head 220 can move along an axis in the direction 232. The mask 210 is supported above the micro-LED display to be vertically separated from walls 20 on the backplane 16 at a distance 203 of 0.1-2 mm. Alternatively, the mask 210 can be moved into contact with the micro-LED display. The mask 210 can have apertures 213 of the same size, and optionally of the same shape, as the subpixel wells 50 that are to be filled with color conversion material. For example, the apertures 213 can be 8-10 microns across. In some implementations, the size of feature holes in a mask can be much larger than the size of recess 22 of each subpixel well 50, i.e., the size of feature holes can be 10-200 microns. The size of the apertures 213 is less than the pitch between the subpixels.

The print head 220 is located above the mask 210, e.g., at a distance 205 of 0.25-2 mm. The print head 220 is controlled to selectively deposit droplets 222 of ink formulation into corresponding subpixel wells 50. In some implementations, the droplets are ejected and free fall under gravity toward the display 10.

As the device resolution increases, the size of the subpixel wells 50 shrinks, and the droplet volume or weight needs is also reduced to avoid overflow of the wells 50 and/or to simply fit within the wells 50. As a result, the droplets becomes more affected by air resistance or air currents, Ideally, droplets 222 dispensing from the print head 220 are delivered into a corresponding subpixel well 50, However, droplets 224 that deviate from a desired path and that would impinge wells corresponding to other colors can be blocked by the mask 210. Ideally, the droplets will not spill over the corresponding subpixel cells, as shown in FIG. 2A. However, spill-over can happen between subpixel wells, and will be discussed below.

FIG. 2B is a schematic cross-sectional view of a portion of a micro-LED array from FIG. 2A. The portion is surrounded by dashed square in FIG. 2A. Within each subpixel well 50, each individual micro-LED (14a, 14b or 14c) includes a first semiconductor layer 54 having a first doping, an active layer 56, and a second semiconductor layer 58 having a second opposite doping. For example, the first semiconductor layer 54 can be an n-doped gallium nitride (n-GaN) layer, the active layer 56 can be a multiple quantum well (MQW) layer, and the second semiconductor layer 58 can be a p-doped gallium nitride (p-GaN) layer. Each micro-LED 14a, 14b, 14c corresponds to the first, second and third colors. In addition, conductive contacts 60 can be deposited. For example, a p-contact 60a and an n-contact 60b can be deposited onto the n-GaN layer 54 and p-GaN layer 58, respectively.

Similarly, the backplane 16 is fabricated to include the circuitry 18, as well as electrical contacts 70. The electrical contacts 70 can include first contacts 70a, e.g., drive contacts, and second contacts 70b, e.g., ground contacts. As shown in FIG. 2B, the first contacts 60a can contact the first contacts 60a, and the second contacts 70b can contact the second contacts 70b.

FIGS. 3A-3J illustrate an example method of selectively forming color conversion agent (CCA) layers over a micro-LED array. The method as shown in FIGS. 3A-3J can be applied in a screen printing system.

For a screen printing system, the masks (210a, 210h, and 210c) are at least locally in contact with the walls 20. Initially, a first photo-curable fluid 30a can be deposited in the subpixel well of the micro-LED 14b. In particular, an ink spreader 250, e.g., a wiper blade or roller, spreads the first photo-curable fluid across the back surface of a first screen mask 210a and through apertures 213 in the first screen mask 210a into the corresponding wells. The first screen mask 210a can be moved into contact with the display, e.g., in contact with the walls 20 fix the printing process, and then retracted. Fluid remaining on the back side of the screen mask 210a after printing can be removed or recycled, e.g., by a scraper, e.g., a wiper.

Ideally, assuming the apertures 213 are smaller than the subpixel well, e.g., smaller than the spacing between the walls 20, and the mask 210a contacts the walls 20, the first photo-curable fluid 30a would be deposited only into the wells of the subpixels of the desired color, e.g., subpixels 14b. However, in some situations, the first photo-curable fluid 30a can be deposited into the wells of adjacent sub-pixels.

Figure 3B:
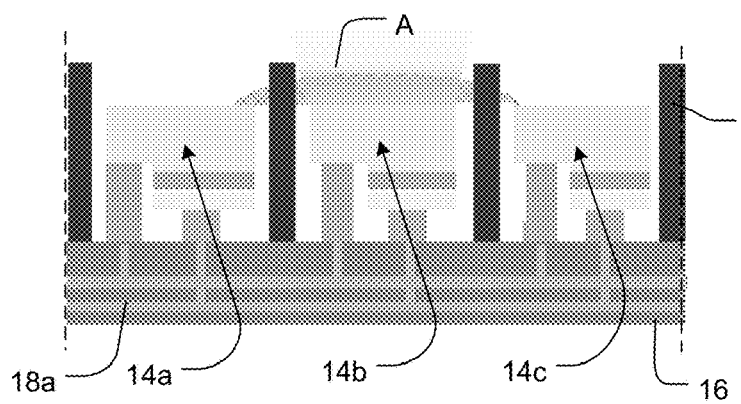

Next, as shown in FIG. 3B, the circuitry 18 of the backplane 16 is used to selectively activate a first plurality of micro-LEDs 14b. This first plurality of micro-LEDs 14b correspond to the sub-pixels of a first color. In particular, the first plurality of micro-LEDs 14b correspond to the sub-pixels for the color of light to be generated by the color conversion components in the photo-curable fluid 30a. For example, assuming the color conversion component in the first photo-curable fluid 30a will convert light from the micro-LED 14 into red light, then only those micro-LEDs 14b that correspond to red sub-pixels are turned on. Because the micro-LED array is already integrated with the backplane circuitry 18, power can be supplied to the micro-LED display 10 and control signals can be applied by a microprocessor to selectively turn on the micro-LEDs 14b.

Figure 3C:
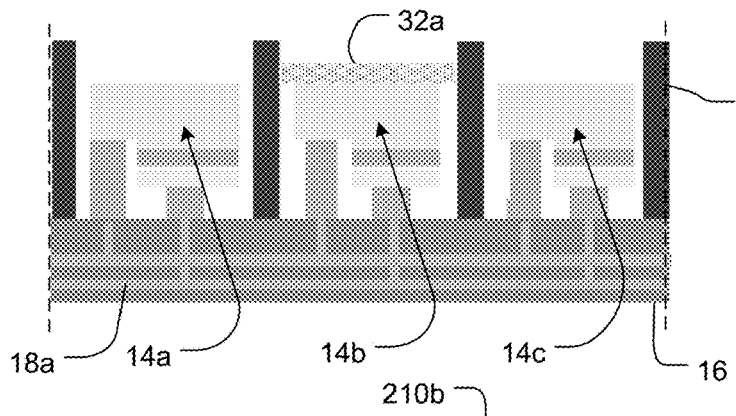

Referring to FIGS. 3B and 3C, activation of the first plurality of micro-LEDs 14b generates illumination A (see FIG. 3B) which causes in-situ curing of the first photo-curable fluid 30a to form a first solidified color conversion layer 32a (see FIG. 3C) over each activated micro-LED 14b. In short, the first photo-curable fluid 30a is cured to form color conversion layers 32a, but only on the selected micro-LEDs 14b. For example, a color conversion layer 32a for converting to red light can be formed on each micro-LED 14b.

The curing process can be retained to cure the first photo-curable fluid 30a inside the subpixel well of micro-LEDs 14b only. The strength of illumination A, e.g., UV lights, from micro LEDs 14b, and the time period of light curing can be controlled accordingly. After curing, the uncured fluid spilt over in the neighbor subpixel wells are be removed, i.e., evaporated, or washed away. In some implementations, the uncured first photo-curable fluid 30a is simply rinsed from the display with a solvent, e.g., water, ethanol, toluene or methylethylketone, or a combination thereof. If the photo-curable fluid 30a includes a negative photoresist, then the rinsing fluid can include a photoresist developer for the photoresist. Then the micro-LEDs 14b are dried and ready for the following steps.

Figure 3D:
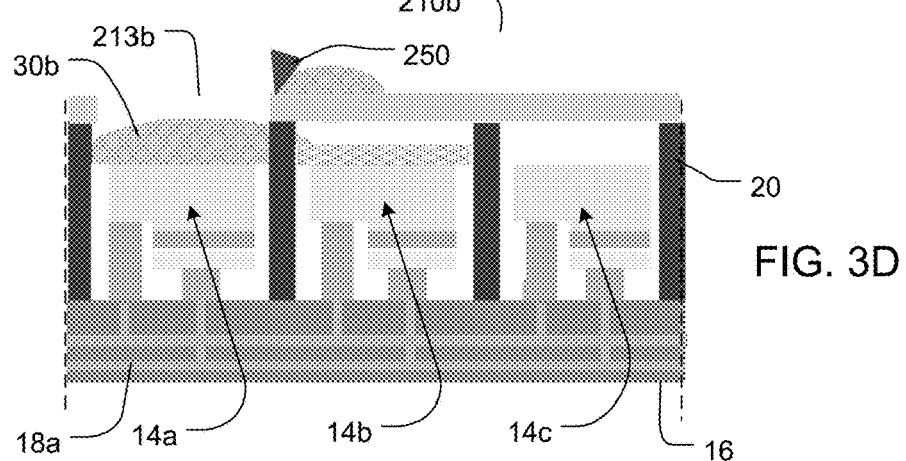
Figure 3E:
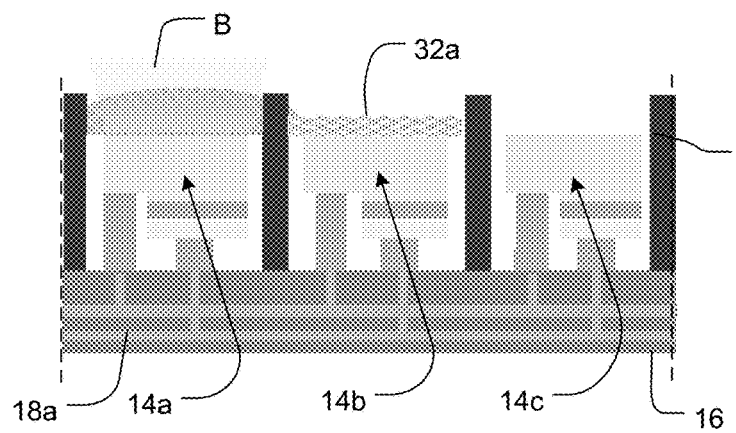
Figure 3F:
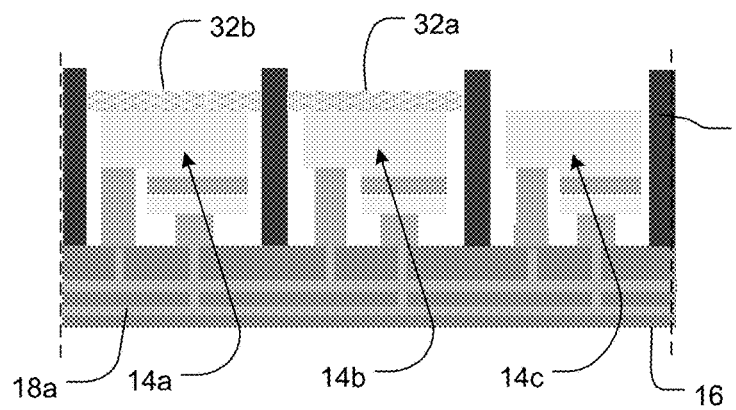

Referring to FIG. 3D-3F, the treatment described above with respect to FIGS. 3A-3C is repeated, but with a second screen mask 210b, a second photo-curable fluid 30b and activation of a second plurality of micro-LEDs 14a. The second screen mask 210b has apertures 213b that align with the wells 50 of the second plurality of micro-LEDs 14a. The apertures feature holes of the second screen mask 210b can be the same size, and optionally the same shape, as the recess, as explained earlier.

In some implementations, the second screen mask 210b can have the same apertures as the first screen mask 210a, e.g., if the subpixel wells for micro-LEDs 14a and 14b are identical in shape and size and layout pattern on the backplane 16. In this case, in some implementations, the first screen mask 210a can be cleaned and then used as the second screen mask. In some implementations, particularly where the subpixel wells for micro-LEDs 14a and 14b differ in shape, size or layout pattern, the second screen mask 210b can have corresponding different apertures and sidewalk accordingly.

The second photo-curable fluid 30b is similar to the first photo-curable fluid 30a, but includes color conversion agents to convert the shorter wavelength light from the micro-LEDs 14a into longer wavelength light of a different second color. The second color can be, for example, blue.

The second plurality of micro-LEDs 14a correspond to the sub-pixels of a second color. In particular, the second plurality of micro-LEDs Na correspond to the sub-pixels for the color of light to be generated by the color conversion components in the second photo-curable fluid 30b. For example, assuming the color conversion component in the second photo-curable fluid 30b will convert light from the micro-LED 14a into blue light, then only those micro-LEDs 14a that correspond to blue sub-pixels are turned on.

After curing with illumination B (see FIG. 3E), non-cured fluids 30b can be removed or washed away as explained earlier, and then the subpixel wells are dried. Finally, a second color conversion layer 32b is formed over each of the second plurality of micro-LEDs 14a.

Figure 3G:
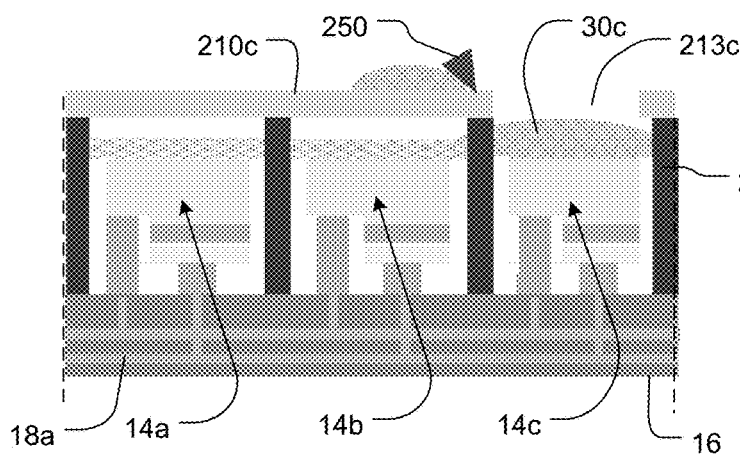
Figure 3H:
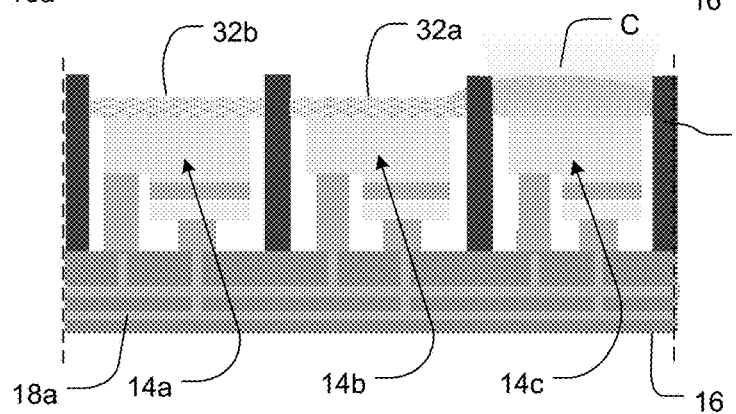
Figure 3I:
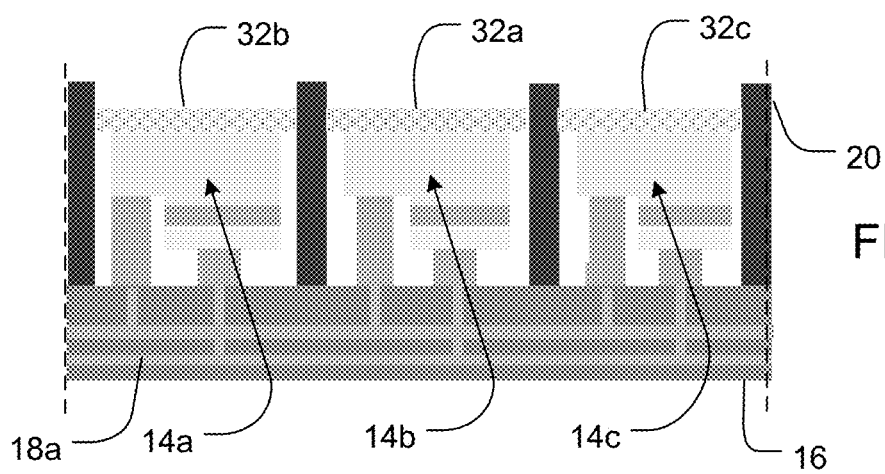

Referring to FIG. 3G-3I, the treatment described above with respect to FIGS. 3A-3C can be optionally repeated yet again, but with a third screen mask 210c, a third photo-curable fluid 30c and activation of a third plurality of micro-LEDs 14c. The third screen mask 210c has apertures 213 that align with the recess of the third plurality of micro-LEDs 14c. The apertures 213 of the third screen mask 210c can be the same size, and optionally the same shape, as the recess, as explained earlier. In some implementations, the third screen mask 210c can have the same apertures as the first and second screen masks, e.g., if the subpixel wells for micro-LEDs 14a, 14b and 14c are identical in shape, size and layout pattern on the backplane 16. In some implementations, the third screen mask 210c can also have apertures of different size, shape and/or layout pattern from the first and second screen masks.

The third photo-curable fluid 30c is similar to the first and second photo-curable fluids 30a and 30b, but includes color conversion agents to convert the shorter wavelength light from the micro-LEDs 14c into longer wavelength light of a different third color. The third color can be, for example, green.

The third plurality of micro-LEDs 14c correspond to the sub-pixels of a third color. In particular, the third plurality of micro-LEDs 14c correspond to the sub-pixels for the color of light to be generated by the color conversion components in the third photo-curable fluid 30c. For example, assuming the color conversion component in the fluid 30c will convert light from the micro-LED 14c into green light, then only those micro-LEDs 14c that correspond to green sub-pixels are turned on.

After curing using illumination C (see FIG. 3H), non-cured fluids 30c can be removed or washed away as explained earlier, and then the subpixel wells are dried. Finally, a third color conversion layer 32c is formed over each of the third plurality of micro-LEDs 14c.

Figure 3J:
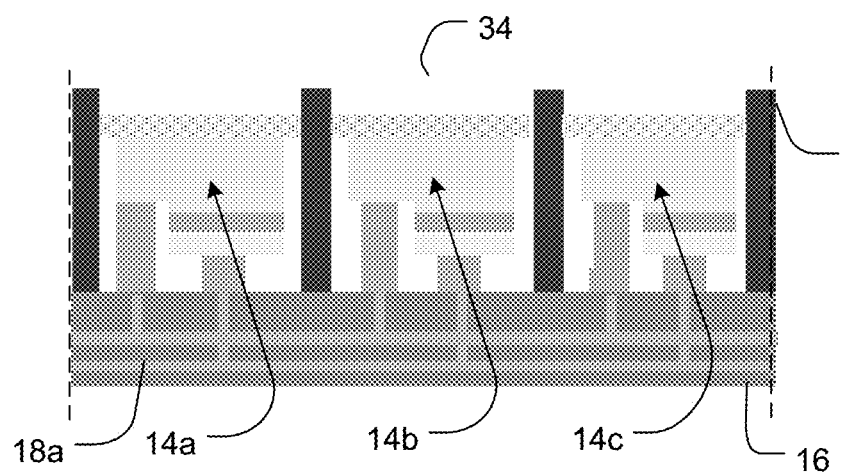

In this specific example illustrated in FIGS. 3A-3H, color conversion layers 32a, 32b, 32c are deposited for each color sub-pixel. This is needed, e.g., when the micro-LEDs generate UV lights. Referring to FIG. 3J, optionally, a UV blocking layer 34 can be deposited on top of all of the micro-LEDs 14. The UV blocking layer 34 can block UV light that is not absorbed by the color conversion layers 32. The UV blocking layer 34 can be a Bragg reflector, or can simply be a material that is selectively absorptive to UV light. A Bragg reflector can reflect UV light back toward the micro-LEDs 14, thus increasing energy efficiency.

For inkjet printing, the process can proceed as described above for FIGS. 3A-3H for the screen printing, but using ink jet printing as shown in FIG. 2A through the apertures in respective shadow masks 210, rather than screen printing using screening mask. Moreover, the shadow masks 210 can be separated from the device 10 by a gap, e.g., the shadow masks 210 do not contact the walls 20 (as shown in FIG. 2A).

In some implementations, one color conversion layer is printed onto subpixel wells that correspond to one color using an inkjet printing process, and another color conversion layer is printed onto subpixel wells that correspond to a different color using a screen printing process. The relationship between a mask used for the inkjet printing process and a mask used for the screen printing process can be as described above for FIGS. 3A-3H.

FIGS. 4A-4K illustrate another example method of selectively forming color conversion agent (CCA) layers over a micro-LED array. The method as shown in FIGS. 4A-4K can be applied in a screen print system or an inkjet print system, with or without using a mask.

Figure 4A:
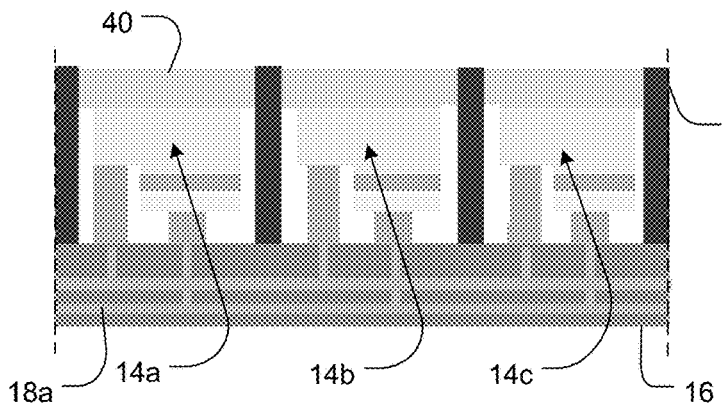
FIGS. 4A-4K illustrate another example method of selectively forming color conversion agent (CCA) layers over a micro-LED array.

As shown in FIG. 4A, a host matrix layer 40 is deposited and cured on top of each micro-LED, e.g., by ink-jetting or screen printing followed by photocuring. The host matrix layer 40 can be generally fluid impermeable.

Figure 4B:
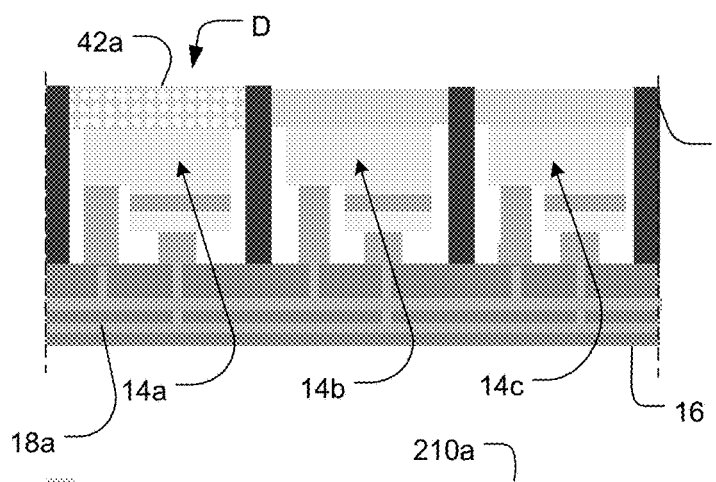

Then, a first plurality of micro-LEDs 14a will be activated by the circuitry 18 to emit an illumination D. The host matrix layer 40 is sensitive to the illumination D, and illuminated regions form a porous structure 42a within the host matrix, as shown in FIG. 4B. The porous structure 42a can be an interconnected inorganic network or a colloidal network. In contrast, the remaining regions of the host matrix layer 40 remain less porous, e.g., generally fluid impermeable.

Figure 4C:
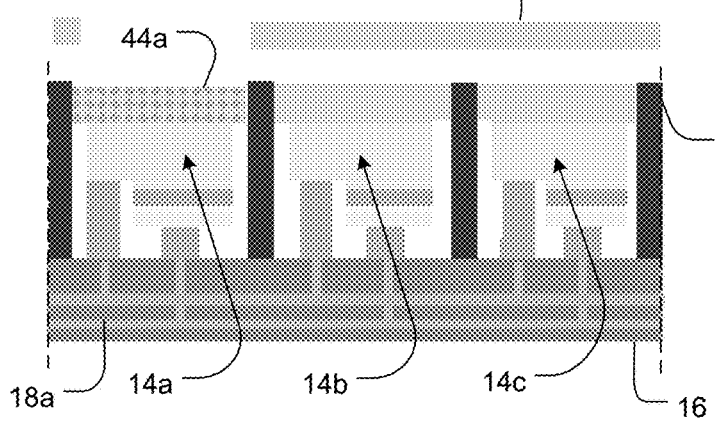

Next, as shown in FIG. 4C, a first photo-curable fluid 44a can be deposited into host matrix structure 42a within corresponding subpixel wells by screen printing or inkjet printing. Optionally, the fluid 44a can be deposited through a high resolution mask 210a. The fluid 44a defuses into the porous host matrix structure 42a. In contrast, the fluid 44a is not absorbed into the other regions of the host matrix layer 40.

The porous structure 42a can improve quality of the resulting color conversion layer. For example, the porous structure 42 can improve the subsequent curing process as the nano-particles, i.e., color conversion agents, of the fluid 44a are homogenously separated by the structure 42a, instead of clumped together. This can reduce unwanted thermal expansion and improve uniformity of absorption of illumination for curing. As a result, total strength of illumination needed for complete curing can be reduced. For example, the total curing illumination can be reduced to 2%-30% of the maximum illumination strength of each micro-LED 14a.

Figure 4D:
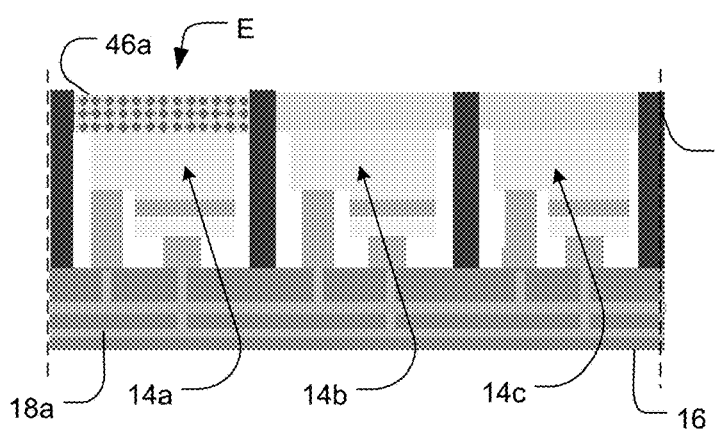

Then, as shown in FIG. 4D, the first plurality of micro-LEDs 14a emit an illumination E to cure the photo-curable fluid within the structure 42a into a color conversion layer 46a, e.g., as explained above for FIG. 3B. The color conversion layer 46a can convert the shorter wavelength light from the micro-LEDs 14a into longer wavelength light of a first color, for example, red.

If the fluid 44a includes a solvent, some solvent may be trapped in the color conversion layers 46a. Referring to FIG. 4D, this solvent can be evaporated, e.g., by exposing the micro-LED array to heat, such as by IR lamps. Evaporation of the solvent from the color conversion layers 46a can result in shrinking of the layers so that the final layers are thinner. Removal of the solvent and shrinking of the color conversion layers 46a can increase concentration of color conversion agents, e.g., quantum dots, thus providing higher color conversion efficiency. Besides, the process of evaporation can skip the step of washing away uncured fluid 44a, thus also can skip the step of drying.

Figure 4E:
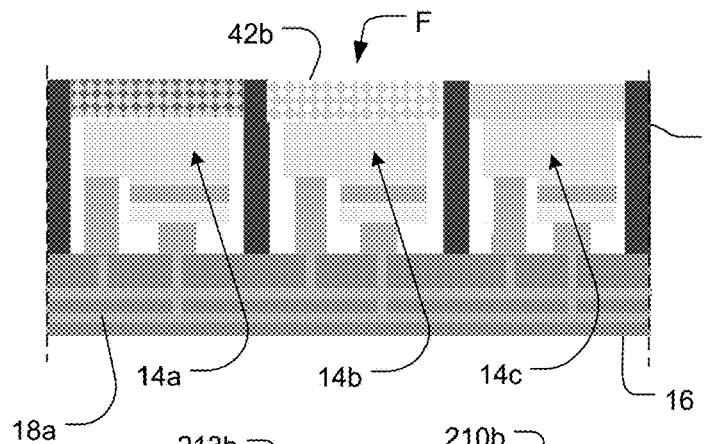
Figure 4F:
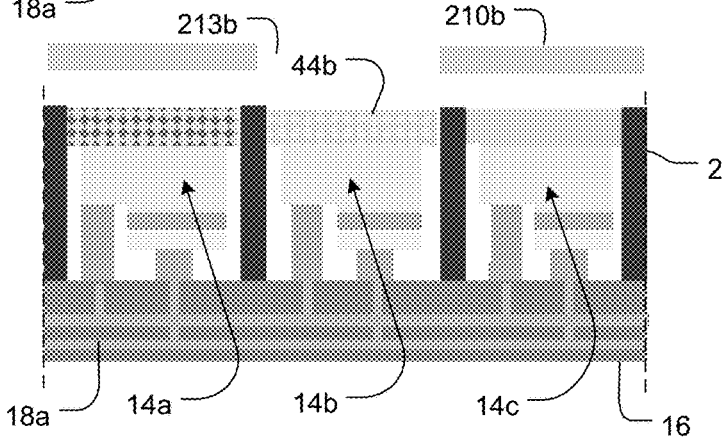
Figure 4G:
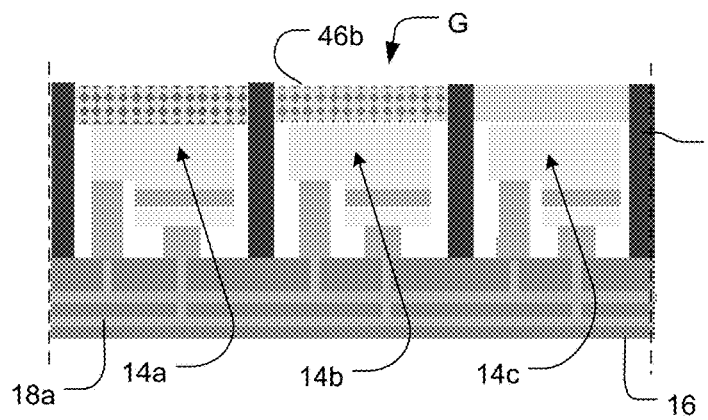

Referring to FIG. 4E-4G, the treatment described above with respect to FIGS. 4B-4D is repeated again, but with a second photo-curable fluid 44b deposited by screen print processing or an inkjet printing, activation of a second plurality of micro-LEDs 14b, and optionally a second mask 210b. The structure 42b can be formed with an illumination F emitted by each of the second plurality of micro-LEDs 14b in the host matrix layer 40. Then the second photo-curable fluid 44b can be homogeneously deposited into the porous structure 42b. After curing with an illumination G emitted by the second plurality of micro-LEDs 14b and evaporating with top IR heating lamps, a second color conversion layer 46b is formed over each of the second plurality of micro-LEDs 14b, and non-cured fluids 44b can be removed as explained earlier. The second color conversion layer 46b can convert the shorter wavelength light from the micro-LEDs 14b into longer wavelength light of a second color, for example, green.

Figure 4H:
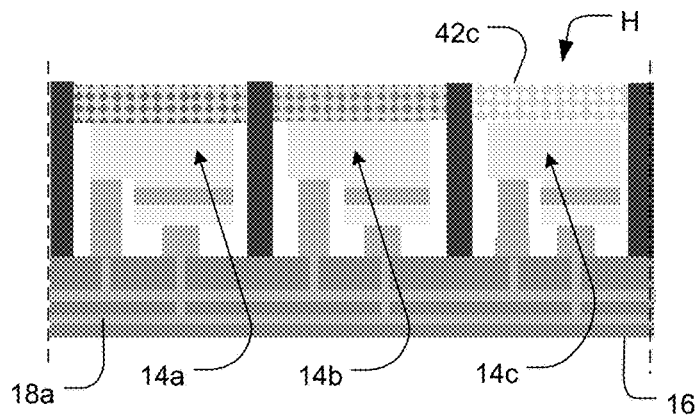
Figure 4I:
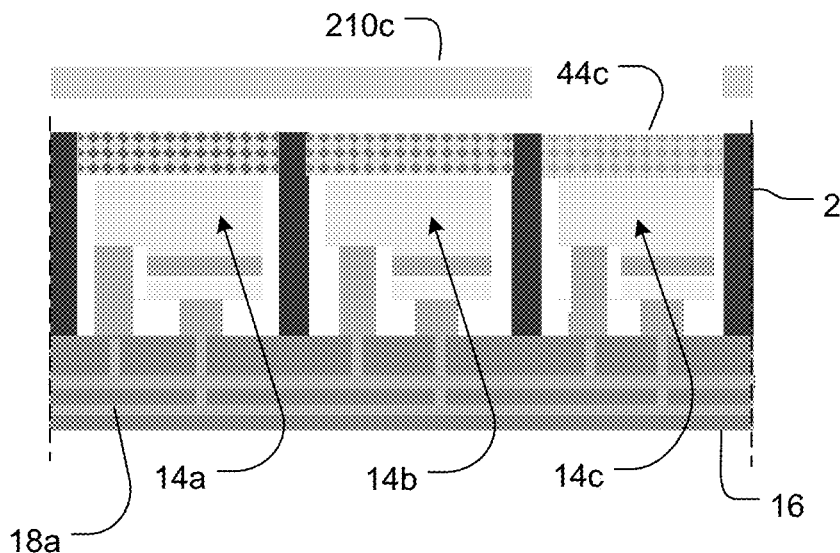
Figure 4J:
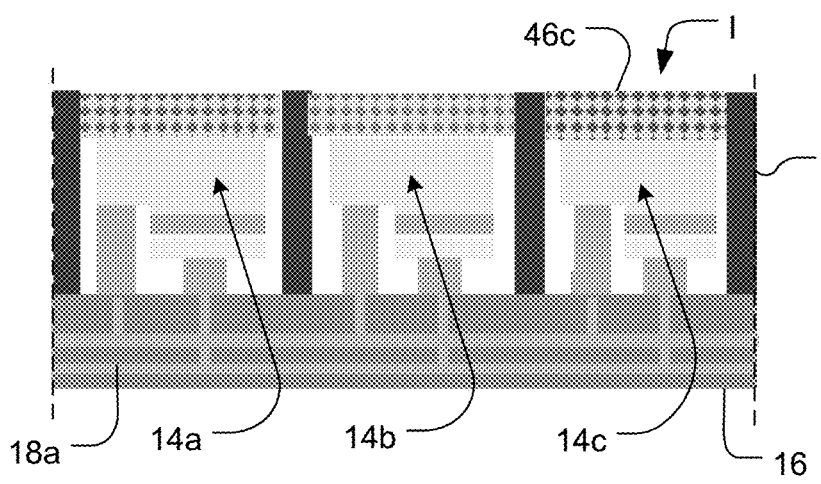

Referring to FIG. 4H-4J, the treatment described above with respect to FIGS. 4B-4D can be optionally repeated yet again, but a third photo-curable fluid 44c deposited by screen print or inkjet printing, activation of a third plurality of micro-LEDs 14c, and optionally with a third mask 210c. The structure 42c can be formed with an illumination H emitted by each of the third plurality of micro-LEDs 14c in the host matrix layer 40. Then the third photo-curable fluid 44c can be homogeneously deposited into the porous structure 42c. After curing with an illumination I emitted by the third plurality of micro-LEDs 14c and evaporating with top IR heating lamps, a third color conversion layer 46c is formed over each of the third plurality of micro-LEDs 14c, and non-cured fluids 44c can be removed as explained earlier. The third color conversion layer 46c can convert the shorter wavelength light from the micro-LEDs 14c into longer wavelength light of a third color, for example, blue.

Figure 4K:

Finally, as shown in FIG. 4K, a UV blocking layer or UV optical layer 44 can be optionally deposited on top of all of the micro-LEDs 14, using the slot coating or inkjet printing technique.

Moreover, FIGS. 5A-5K illustrate another example method of selectively forming color conversion agent (CCA) layers over a micro-LED array. The method as shown in FIGS. 5A-5K can be applied in a screen print system or an inkjet print system, with or without using a mask.

As shown in FIG. 5A, a positive resist layer 51 is first cured on top of each micro-LEDs. The positive resist layer 51 can be generally fluid impermeable to the droplets of the color conversion material. Then, a first plurality of micro-LEDs 14a will be activated by the circuitry 18 to emit an illumination J that will render the illuminate regions of the resist over the micro-LEDs 14a soluble to a developer, e.g., by curing. As shown in FIG. 5B, these portions can then be removed, e.g., by the developer, thereby forming a recess or exposing the top of the first plurality of micro-LEDs 14a.

Next, as shown in FIG. 5C, a first photo-curable fluid 52a can be deposited into corresponding subpixel wells either by screen printing or inkjet printing. Optionally, the photo-curable fluids 52 can be deposited in the subpixel wells through a high resolution mask 210a, similar to those described above. Then, as shown in FIG. 5D, the first plurality of micro-LEDs 14a emit an illumination K to cure the photo-curable fluids 52a into a color conversion layer 54a. The curing process is similar to the processes explained above. The color conversion layer 54a can convert the shorter wavelength light from the micro-LEDs 14a into longer wavelength light of a first color, for example, red.

Figure 5E:
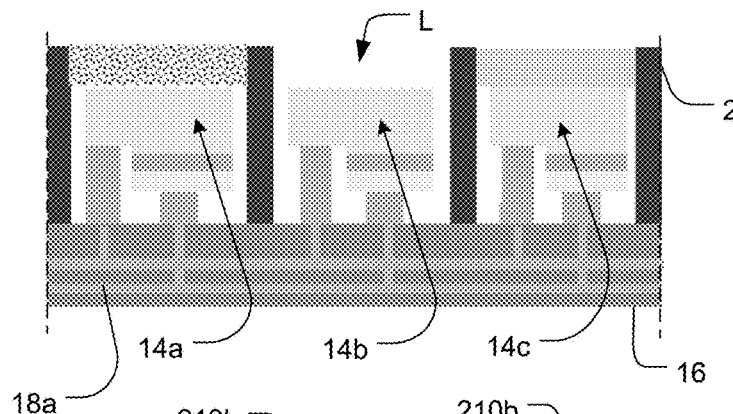
Figure 5F:
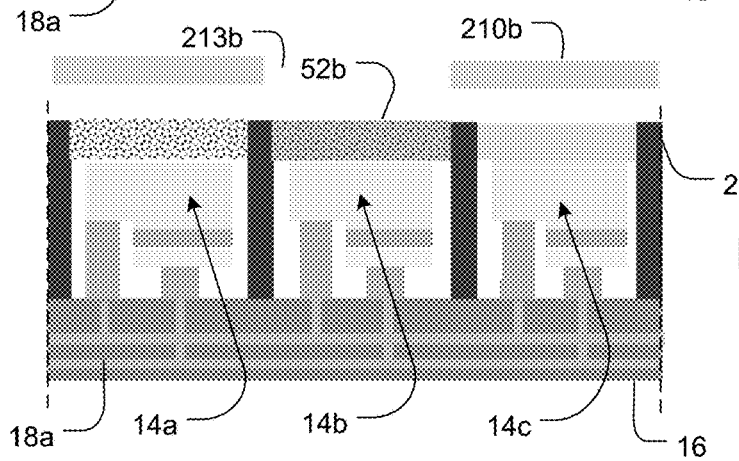
Figure 5G:
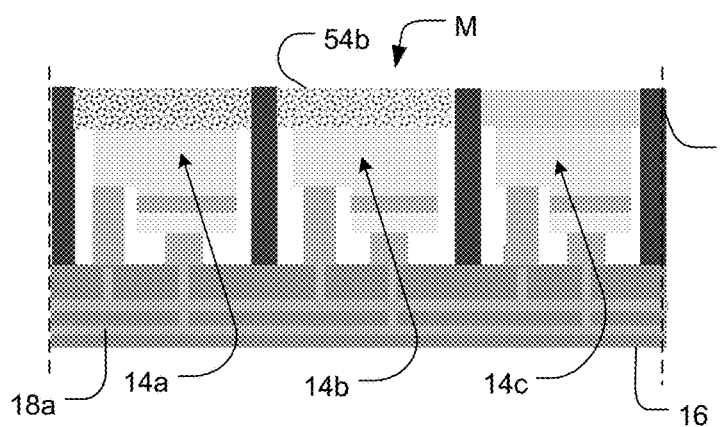

Referring to FIG. 5E-5G, the treatment described above with respect to FIGS. 5B-5D is repeated again, but with a second photo-curable fluid 52b deposited by screen printing or inkjet printing, activation of a second plurality of micro-LEDs 14b, and optionally a second mask 210b. The cavity can be formed by exposure of the positive photoresist with an illumination L emitted by each of the second plurality of micro-LEDs 14b followed by treatment with a developer. Then the second photo-curable fluid 54b can be deposited into corresponding subpixel wells. After curing with an illumination M emitted by the second plurality of micro-LEDs 14b and evaporating with top IR heating lamps, a second color conversion layer 54b is formed over each of the second plurality of micro-LEDs 14b, and non-cured fluids 52b can be removed as explained earlier. The second color conversion layer 54b can convert the shorter wavelength light from the micro-LEDs 14b into longer wavelength light of a second color, for example, green.

Figure 5H:
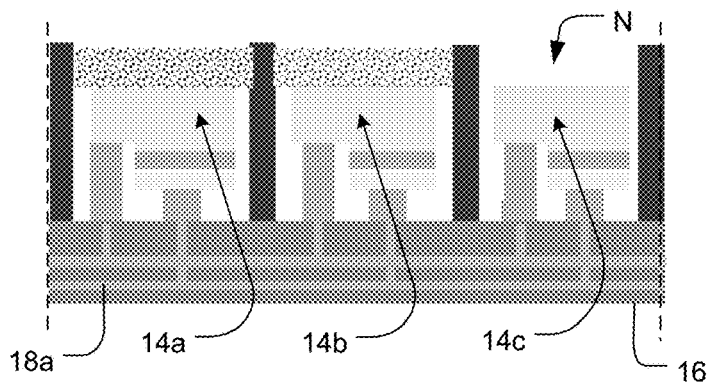
Figure 5I:
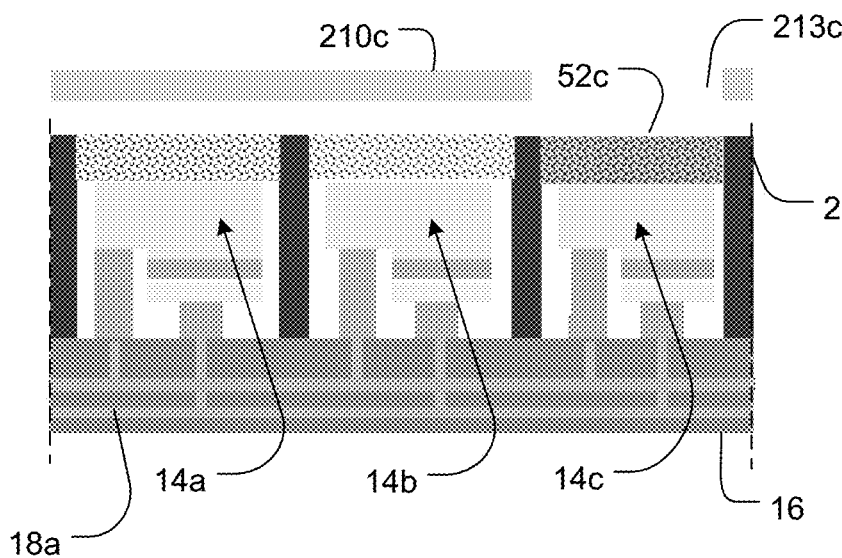
Figure 5J:
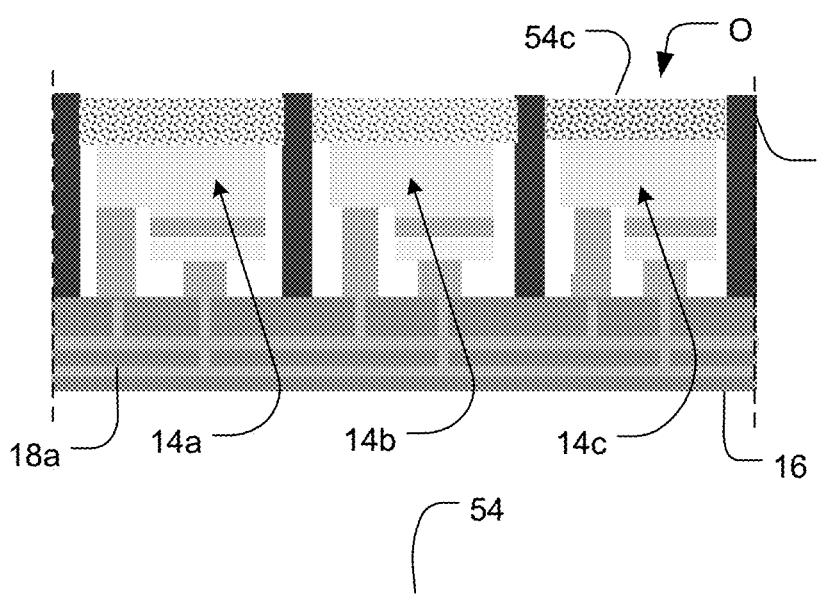

Referring to FIG. 5H-5J, the treatment described above with respect to FIGS. 5B-5D can be optionally repeated yet again, but with a third photo-curable fluid 52c deposited by screen printing or inkjet printing, activation of a third plurality of micro-LEDs 14c, and optionally a third screen mask 210c. The cavity can be formed by exposure of the positive photoresist with an illumination N emitted by each of the third plurality of micro-LEDs 14c followed by treatment with a developer. Then the third photo-curable fluid 54c can be deposited into corresponding subpixel wells. After curing with an illumination O emitted by the third plurality of micro-LEDs 14c and evaporating with top IR heating lamps, a third color conversion layer 54c is formed over each of the third plurality of micro-LEDs 14c, and non-cured fluids 52c can be removed as explained earlier. The third color conversion layer 54c can convert the shorter wavelength light from the micro-LEDs 14c into longer wavelength light of a third color, for example, blue.

Figure 5K:
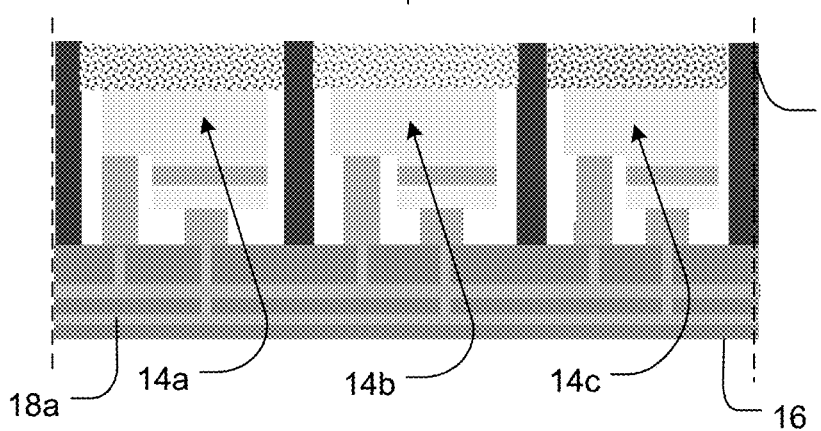

Finally, as shown in FIG. 5K, a UV blocking layer or UV optical layer 54 can be optionally deposited on top of all of the micro-LEDs 14, using the slot coating or inkjet printing technique. Besides, the reflow of the UV blocking layer or UV optical layer 54 can be perform as needed for leveling the top surface of the layer.

Terms of positioning, such as vertical and lateral, have been used. However, it should be understood that such terms refer to relative positioning, not absolute positioning with respect to gravity unless otherwise explicitly stated. For example, laterally is a direction parallel to a substrate surface, whereas vertically is a direction normal to the substrate surface.

It will be appreciated to those skilled in the art that the preceding examples are exemplary and not limiting. For example:

Although the above description focuses on micro-LEDs, the techniques can be applied to other displays with other types of light emitting diodes, particularly displays with other micro-scale light emitting diodes, e.g., LEDs less than about 10 microns across.

Although the above description provides several orders in which the color conversion layers are formed, e.g., red, then blue, then green, or red, then green, then blue, other orders are possible, e.g., blue, then red, then green. In addition, other colors are possible, e.g., orange, or yellow, or white, and color conversion layers that emit wavelengths outside the visible spectrum could be used, e.g., near-UV or IR.

It will be understood that various modifications may be made without departing from the spirit and scope of the present disclosure.

What is claimed is:

1. A method of fabricating a multi-color display, comprising:
    forming a host matrix over a display having a backplane and an array of light emitting diodes electrically integrated with backplane circuitry of the backplane, wherein the host matrix is sensitive to ultraviolet light and to develop internal porous structures when exposed to light of the light emitting diodes;
    activating a first plurality of light emitting diodes in a first plurality of wells to illuminate a portion of the host matrix that is over the first plurality of light emitting diodes to cause the portion of the host matrix to develop internal porous structures;
    dispensing a first photo-curable fluid, the first photo-curable fluid including a first color conversion agent;
    activating the first plurality of light emitting diodes in the first plurality of wells to illuminate and cure the first photo-curable fluid to form a first color conversion layer over each of the first plurality of light emitting diodes to convert light from the first plurality of light emitting diodes to light of a first color; and
    removing an uncured remainder of the first photo-curable fluid.

2. The method of claim 1, further comprising:

activating a second plurality of light emitting diodes in a second plurality of wells to illuminate a portion of the host matrix that is over the second plurality of light emitting diodes to cause the portion of the host matrix to develop internal porous structures;

dispensing a second photo-curable fluid, through a second screen mask, into a second plurality of wells, the second photo-curable fluid including a second color conversion agent, the second screen mask including a second plurality of feature holes arranged on the second mask;

activating the second plurality of light emitting diodes in the second plurality of wells to illuminate and cure the second photo-curable fluid to form a second color conversion layer over each of the second plurality of light emitting diodes to convert light from the second plurality of light emitting diodes to light of a second color; and removing an uncured remainder of the second photo-curable fluid.

3. The method of claim 2, wherein at least one of the first photo-curable fluid and the second photo-curable fluid includes a solvent, and removing an uncured remainder comprises evaporating the solvent.

4. The method of claim 1, wherein the internal porous structures developed within the host matrix include at least one of an interconnected inorganic network, a colloidal network, or a thermal conductive network.

5. The method of claim 1, wherein dispensing the first photo-curable fluid includes delivering the first photo-curable fluid through a plurality of apertures in a first screen mask.

6. The method of claim 1, wherein the first color and second color are selected from blue, green and red.

7. The method of claim 1, comprising forming a layer over the array of light emitting diodes, the layer including at least one of a ultraviolet blocking layer, an optical layer, or a die slot coating.

8. The method of claim 7, wherein the layer is formed using a third screen mask or through an inkjet process.

9. A method of fabricating a multi-color display, comprising:

forming a positive photoresist layer over a display having a backplane and an array of light emitting diodes electrically integrated with backplane circuitry of the backplane;

activating a first plurality of light emitting diodes in a first plurality of wells to expose a first portion of the positive photoresist layer that is over the first plurality of light emitting diodes;

treating the positive photoresist layer with a developer to remove the exposed first portion of the positive photoresist layer;

dispensing a first photo-curable fluid into the first plurality of wells, the first photo-curable fluid including a first color conversion agent;

activating the first plurality of light emitting diodes in the first plurality of wells to illuminate and cure the first photo-curable fluid to form a first color conversion layer over each of the first plurality of light emitting diodes to convert light from the first plurality of light emitting diodes to light of a first color; and removing an uncured remainder of the first photo-curable fluid.

10. The method of claim 9, further comprises:

activating a second plurality of light emitting diodes in a second plurality of wells to expose a second portion of the positive photoresist layer that is over the second plurality of light emitting diodes;

treating the positive photoresist layer with a developer to remove the exposed second portion of the positive photoresist layer;

dispensing a second photo-curable fluid into the second plurality of wells, the second photo-curable fluid including a second color conversion agent;

activating the second plurality of light emitting diodes in the second plurality of wells to illuminate and cure the second photo-curable fluid to form a second color conversion layer over each of the second plurality of light emitting diodes to convert light from the second plurality of light emitting diodes to light of a second color; and removing an uncured remainder of the second photo-curable fluid.

11. The method of claim 10, wherein at least one of the first photo-curable fluid and the second photo-curable fluid includes a solvent, and removing an uncured remainder comprises evaporating the solvent.

12. The method of claim 9, wherein the dispensing the first photo-curable fluid includes delivering the first photo-curable fluid through a plurality of apertures in a first screen mask.

13. The method of claim 9, comprising forming a layer over the array of light emitting diodes, the layer including at least one of a ultraviolet blocking layer, an optical layer, or a die slot coating.

* * * * *